(12) United States Patent
Stalf et al.

(10) Patent No.: US 7,738,847 B2
(45) Date of Patent: Jun. 15, 2010

(54) AUTOMATIC GAIN CONTROL FOR A TUNER

(75) Inventors: Stefan Stalf, Haar (DE); Veit Armbruster, St. Georgen (DE)

(73) Assignee: Thomson Licensing, Boulogne-Billacourt (FR)

( * ) Notice: Subject to any disclaimer, the term of this patent is extended or adjusted under 35 U.S.C. 154(b) by 152 days.

(21) Appl. No.: 10/499,546

(22) PCT Filed: Dec. 9, 2002

(86) PCT No.: PCT/EP02/13901

§ 371 (c)(1),
(2), (4) Date: Jun. 21, 2004

(87) PCT Pub. No.: WO03/055062

PCT Pub. Date: Jul. 3, 2003

(65) Prior Publication Data

US 2005/0032495 A1 Feb. 10, 2005

(30) Foreign Application Priority Data

Dec. 21, 2001 (DE) ................. 101 63 582

(51) Int. Cl.
*H04B 1/16* (2006.01)
(52) U.S. Cl. .............. 455/200.1; 455/232.1; 455/240.1; 455/250.1; 375/345; 375/350
(58) Field of Classification Search ............. 455/232.1, 455/234.1, 234.2, 250.1, 200.1, 266, 339, 455/240.1; 375/345, 316, 350; 330/278, 330/291
See application file for complete search history.

(56) References Cited

U.S. PATENT DOCUMENTS

| 5,390,345 | A | * | 2/1995 | Wada et al. | ............... 455/234.1 |
| 5,483,694 | A | * | 1/1996 | Bartels et al. | ................ 455/295 |
| 5,630,220 | A | * | 5/1997 | Yano | ....................... 455/234.1 |
| 6,385,262 | B1 | * | 5/2002 | Gustafsson et al. | ......... 375/350 |
| 6,683,919 | B1 | * | 1/2004 | Olgaard et al. | .............. 375/316 |

FOREIGN PATENT DOCUMENTS

| EP | 602370 | | 6/1994 |
| GB | 2004428 | * | 3/1979 |
| GB | 2004428 | | 3/1997 |

OTHER PUBLICATIONS

Searcha Report Dated Mar. 24, 2003.

* cited by examiner

*Primary Examiner*—Tuan H Nguyen
(74) *Attorney, Agent, or Firm*—Robert D. Shedd; Joseph J. Opalach; Brian J. Cromarty

(57) ABSTRACT

The circuit arrangement comprises a tuner with a control amplifier and a mixer connected downstream, and an automatic gain control. The automatic gain control contains a weighting filter, which is connected to the output of the mixer, upstream of an intermediate frequency filter, and which supplies the control signal for the control amplifier of the tuner via a detector. The weighting filter has, in particular, a passband, which corresponds to the passband of the intermediate frequency filter and at least partly encompasses at least one or two adjacent program channels. As a result of this, the control amplifier is better tuned under difficult reception conditions, since, by means of the weighting filter, adjacent channels, relative to the passband of the intermediate frequency filter, are also concomitantly included in the control signal.

17 Claims, 2 Drawing Sheets

AUTOMATIC GAIN CONTROL FOR A TUNER

Figure 1:
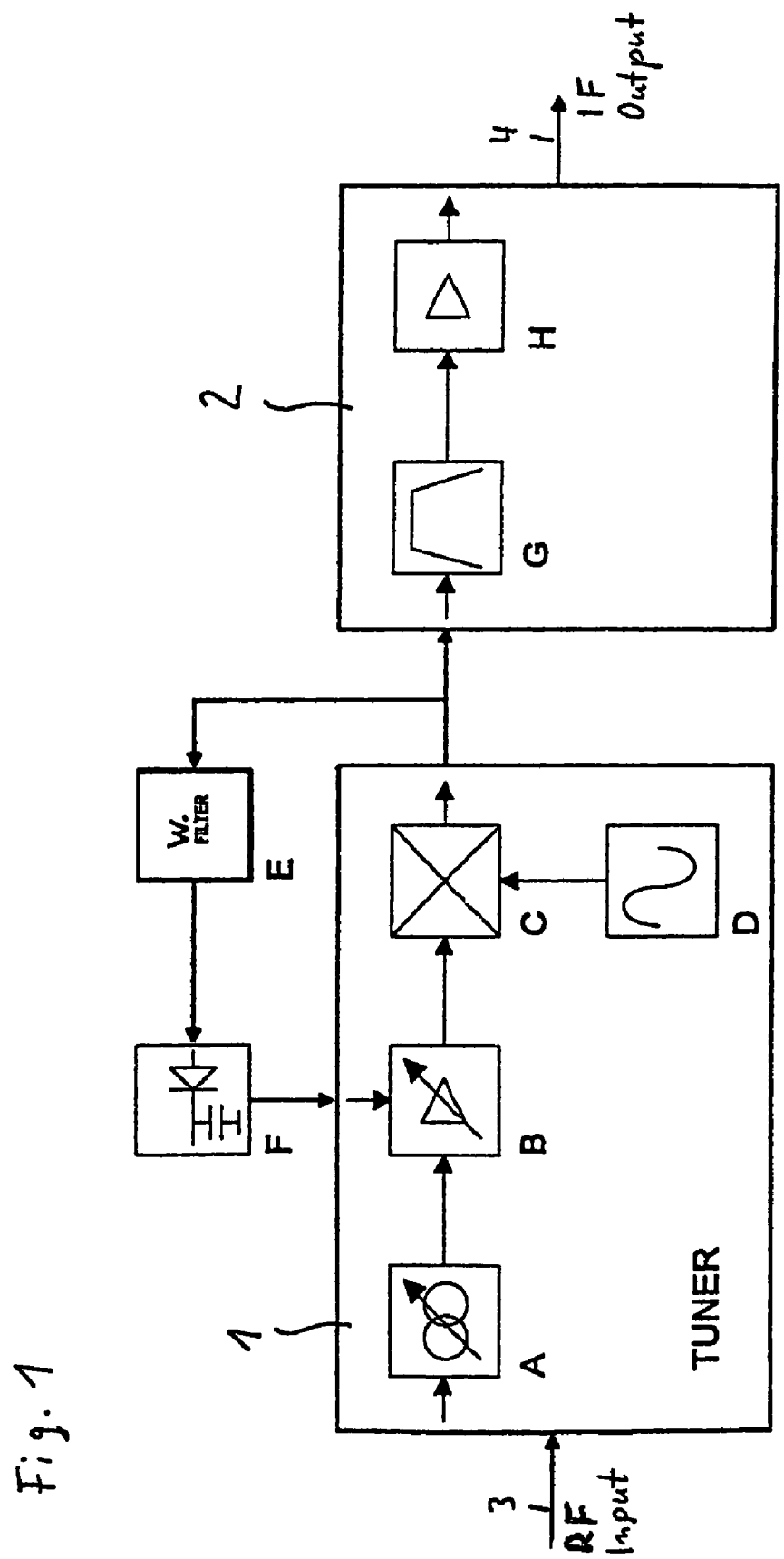

This application claims the benefit, under 35 U.S.C. §365 of International Application PCT/EP02/13901, filed Dec. 9, 2002, which was published in accordance with PCT Article 21(2) on Jul. 3, 2003 in English and which claims the benefit of German patent application No. 10163582.6, filed Dec. 21, 2001.

The present invention is based on a circuit arrangement with a tuner comprising a control amplifier and a mixer connected downstream, and also having an automatic gain control for the control amplifier. Circuit arrangements of this type are used for example in television sets in order to convert the signals from an antenna or a cable, which contain television programs to an intermediate frequency.

In known tuners of this type, the input signals are selected in preliminary circuits according to specific ranges, for example according to VHF ranges, UHF range and hyperband. These selected ranges, which encompass different frequency bands, are subsequently amplified by a control amplifier before being passed to a mixer. The mixer is additionally fed a second signal from an oscillator whose oscillator frequency is set in a manner dependent on a selected program channel, so that the desired program channel is reduced to a fixedly prescribed intermediate frequency.

The down-converted signal is subsequently fed to an intermediate frequency filter, also called channel filter, which is tuned to the vision carrier and the sound carrier of the desired program, and in which the adjacent channels are separated. A surface acoustic wave filter is usually used as the intermediate frequency filter. The output signal of the intermediate frequency filter is subsequently amplified in an intermediate frequency amplifier, so that it has a suitable level for a demodulation.

In order to compensate for different antenna voltages of the transmitters and in order to avoid overdriving of the mixer and of the downstream stages, an automatic gain control (AGC) is used for the tuner. For this, use is made of the output signal of the intermediate frequency filter whose level corresponds to the input voltage of a program channel of a corresponding transmitter. A control voltage is obtained from this signal and is fed to the control amplifier in the tuner. In this case, the control is chosen such that the intermediate frequency filter is fed a constant signal voltage for a respectively desired program channel.

The object of the present invention is to specify, for a circuit arrangement of the type mentioned above, a gain control which enables good selection of a desired program channel even under complicated reception conditions, for example if both analogue and digital program channels are present at the input of the tuner.

This object is achieved by means of the features of Claim 1 for a circuit arrangement and by means of the features of Claim 10 for a method. Advantageous exemplary embodiments of the invention are specified in the subclaims.

The circuit arrangement according to the invention comprises a tuner with a control amplifier and a mixer connected downstream, and also an automatic gain control. The automatic gain control comprises a weighting filter, which is connected to the output of the mixer, and which supplies the control signal for the control amplifier of the tuner via a detector.

The weighting filter has, in particular, a passband which corresponds to the passband of an intermediate frequency filter connected downstream of the tuner and at least partly encompasses at least one or two adjacent program channels. The weighting filter may be designed for example as a bandpass filter encompassing the two or four nearest adjacent channels or else as a high-pass or low-pass filter. Higher filter arrangements and, if appropriate, pole points (frequency traps) are also possible in this case. Thus, the weighting filter can, in particular, be adapted to given adjacent channel conditions of a transmission system. Moreover, it can be constructed relatively simply using cost-effective components.

Thus, the automatic gain control does not use a control signal, which is tapped off downstream of the intermediate frequency filter, but rather a control signal, which is already tapped off downstream of the mixer. As a result of this, the control amplifier is better tuned under difficult reception conditions, since by means of the weighting filter, adjacent channels, relative to the passband of the intermediate frequency filter, are also concomitantly included in the control signal.

By way of example, if a desired program channel supplies is only a weak signal voltage and a program of another transmitter with a very high signal voltage lies in a next-but-one program channel, then the adjacent program channel is essentially depressed by the weighting filter, so that the desired program channel is sufficiently amplified in the control amplifier for a good signal-to-noise ratio. At the same time, however, the high level of the next-but-one program channel is concomitantly incorporated into the control voltage for the control amplifier, so that the mixer and also downstream stages are not overdriven. As a result of this, the arrangement yields an improved linearity and also an increased signal-to-noise ratio in a reception system. This applies particularly to critical reception situations, when there are very large level differences between the useful channel and directly adjacent channels, which may represent interference signals with a high level.

Figure 2:
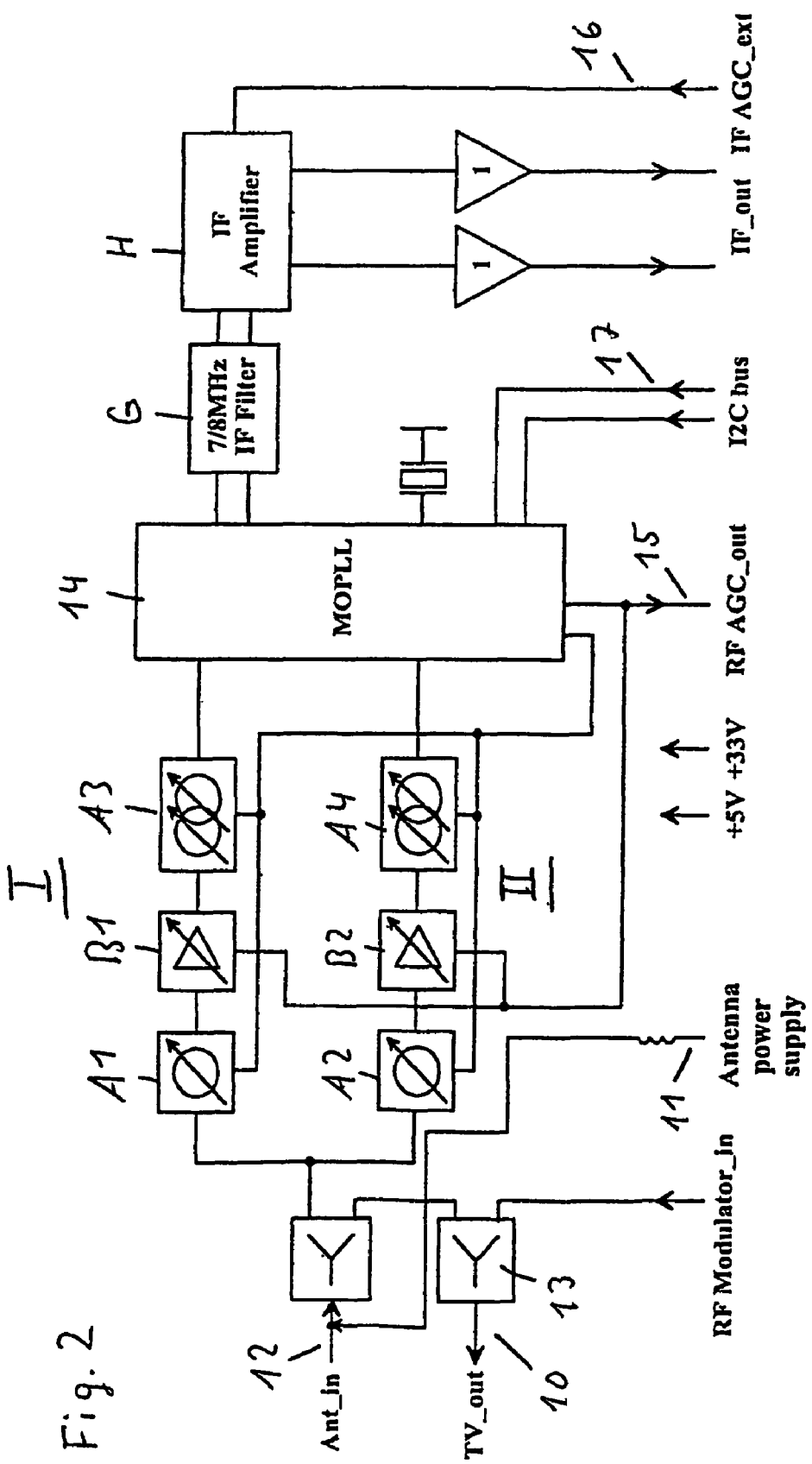

The invention is explained in more detail below by way of exemplary embodiments as illustrated schematically in the figures, which show:

FIG. 1 a circuit arrangement with a tuner, an intermediate frequency stage, and an automatic gain control for the tuner, and FIG. 2 a block diagram of a tuner module for digital terrestrial television reception.

FIG. 1 schematically illustrates a tuner 1 having a radiofrequency input 3 for the reception of program channels, in particular television channels. The radiofrequency signal is supplied for example by a terrestrial antenna or via a cable. The input signal is selected in the tuner 1 in a known manner in preselection circuits A according to specific ranges, such as, for example, VHF ranges, UHF range and hyperband, and encompasses for example a frequency range from 50 to 860 MHz. The selected signal is subsequently fed to a control amplifier B before being passed to a mixer C in the tuner 1. The tuner 1 furthermore contains an oscillator D for down-converting the radiofrequency signal in the mixer C into an intermediate frequency range.

The output signal of the mixer C is subsequently fed to an intermediate frequency (IF) stage 2 containing an intermediate frequency filter G. The latter is a steep-edged filter with a fixed passband, which filters out a desired program channel. A surface acoustic wave filter (SAW) is usually used for this. In this case, the frequency of the oscillator D is chosen such that a desired program channel falls precisely within the passband of the intermediate frequency filter G.

The output signal of the intermediate frequency filter G is subsequently amplified in an intermediate frequency amplifier H, so that it can subsequently be fed to a demodulator via an IF output 4.

The control amplifier B is controlled by means of an automatic gain control, which uses the output signal of the mixer C, that is to say the signal upstream of the intermediate frequency filter G. The automatic gain control comprises a weighting filter E, which is connected to the output of the mixer C, in particular with an input to a node arranged between the output of the mixer C and the input of the intermediate frequency filter G, and which outputs a control signal for the control amplifier B for the gain control via a detector F. The detector F is, for example, a mean value or peak value rectifier comprising for example a diode and a capacitance connected downstream.

The weighting filter E may be, for example, a simple bandpass filter, a high-pass filter or a low-pass filter. Higher filter arrangements and, if appropriate, pole points for the weighting filter E are also possible. An advantageous exemplary embodiment is, for example, a bandpass filter encompassing the two or four nearest adjacent channels, with respect to the passband of an intermediate frequency filter connected downstream of the tuner. This corresponds to one or two adjacent channels above and below the intermediate frequency filter.

The control amplifier B contains, for example, a MOSFET having a second gate terminal for the gain control, and the gain control takes place in such a way that the gain of the control amplifier B is large if the detector F supplies a low signal, and vice versa.

The weighting filter E has, in particular, a passband, which encompasses the passband of the intermediate frequency filter G, and also at least partly concomitantly encompasses at least one or two adjacent program channels. As a result of this, the automatic gain control is adapted to given adjacent channel conditions of the channel filter G. Another amplifier and buffer stage, not illustrated in the figure, is advantageously arranged upstream of the weighting filter E.

The circuit arrangement is particularly suitable for critical reception situations, when there are very large level differences between the useful channel and directly adjacent channels, that is to say adjacent channels supply interference signals with a very high level. Since adjacent channels are concomitantly taken into account by the weighting filter E, the circuit arrangement enables a reception system with improved linearity and with a high signal-to-noise ratio. This applies both to the transmission of analogue signals and to digital signals.

Preselection to a desired program channel also takes place in the preselection circuit A, which contains concurrent filters. The automatic gain control can therefore be constructed as a simple analogue circuit with cost-effective components. The gain control can, in particular, be concomitantly integrated in the tuner 1 itself within the screened housing, since the output signal of the mixer C can be tapped off within the housing for control purposes. The gain control may also be partly or completely integrated into an integrated circuit.

In FIG. 2 a block diagram of a tuner module for digital terrestrial television reception is shown, which is in compliance with the European digital terrestrial standard ETS 300 744. The tuner module comprises a VHF/UHF tuner, an antenna loop through function with a TV output and an antenna power function 11 to feed through a supply voltage for an active indoor antenna to the antenna input 12. The tuner module comprises further a combiner 13 to feed through a RF modulator signal 4 to a TV output 3.

The frequency ranges VHF III and UHF IV/V of the VHF/UHF tuner are splitted into two sections I, II for gain setting and filtering. The two sections I, II comprise each first and second preselection circuits A1, A3 respectively A2, A4, between each a control amplifier B1 respectively B2 is coupled for automatic gain control.

The outputs of the sections I, II are coupled to a mixer/oscillator IC 14 which downconverts a selected program to the standard intermediate frequency (IF) of 36 MHz. Coupled to the mixer/oscillator IC 14 is an IF filter section G, which provides channel filtering with switchable 7 or 8 MHz bandwidth. The output of the IF filter section G is coupled to an IF amplifier H, which provides a sufficient output level to be connected directly to an A/D converter.

The mixer/oscillator IC 14 has already integrated a weighting filter and a subsequent detector as shown in FIG. 1, and drives the control amplifiers B1 and B2 directly via an AGC signal 15. The output level of the IF amplifier H is adjustable by an external AGC signal 16. Tuning and band switching are made with a programmable tuning system controlled via an I²C bus 17. The module is built on a low-loss printed circuit board carrying all the components in a metal housing frame with top and rear covers. As the supply voltages for the tuner module 5 Volts and 33 Volts supplies are used.

Further configurations of the invention are within the abilities of a person skilled in the art. The automatic gain control may, in particular, also contain a plurality of weighting filters, for example weighting filters with different passbands for different preselection circuits A. The weighting filter E may, for example, also be constructed as an adaptive digital filter, which adapts the control signal to the reception conditions whilst taking account of the adjacent program channels. The circuit arrangement is particularly suitable for the reception of television programs, but it is not restricted to this type of program.

The invention claimed is:

1. Circuit arrangement for reception of television channels, comprising:
a tuner having a control amplifier, an automatic gain control for said control amplifier and a mixer connected with an input to an output of said control amplifier, the circuit arrangement comprising further a channel filter coupled with an input to an output of said mixer for filtering out a desired television channel, said mixer converting said desired television channel into an intermediate frequency range for said channel filter, said automatic gain control comprising a detector and a weighting filter, the weighting filter being coupled with an output to an input of said detector and with an input to the output of said mixer, upstream of said channel filter, for providing a control signal for said control amplifier via said detector, said weighting filter being a bandpass filter with a passband wider than the passband of said channel filter, which encompasses both the passband of said channel filter and at least one adjacent television channel, for adapting said automatic gain control to given adjacent channel conditions of said channel filter; and wherein said tuner has a preselection circuit for the preselection of television channels, and a mixer oscillator for converting said desired television channel to the intermediate frequency range as defined by said channel filter.

2. Circuit arrangement according to claim 1, wherein said weighting filter has a passband which encompasses the passband of said channel filter and at least one adjacent television channel above said channel filter and one adjacent television channel below said channel filter.

3. Circuit arrangement according to claim 2, wherein said bandpass filter is adapted to given adjacent channel conditions of a transmission system.

4. Circuit arrangement according to claim 1, wherein said detector contains a diode and a capacitor and is designed as a rectifier.

5. Circuit arrangement according to claim 1, wherein an amplifier stage is arranged upstream of said weighting filter.

6. Circuit arrangement according claim 1, wherein said automatic gain control is integrated together with said tuner into a tuner module with a screened housing.

7. Circuit arrangement according to claim 1, wherein said tuner is designed for the reception of analog and digital television channels.

8. Television tuner comprising a control amplifier, an automatic gain control, and a mixer connected downstream of said control amplifier, said mixer converting a television channel into an intermediate frequency range for a subsequent channel filter, said automatic gain control comprising a detector and a weighting filter connected with an input to an output of said mixer, upstream of said television channel filter, for providing a control signal for said control amplifier via said detector, wherein said weighting filter has a passband wider than the passband of said channel filter, which encompasses the passband of said channel filter and at least one adjacent television channel, and wherein said tuner has a preselection circuit for the preselection of television channels, and a mixer oscillator for converting a desired television channel to the intermediate frequency range as defined by said television channel filter.

9. Tuner according to claim 8, wherein said detector contains a diode and a capacitor and is designed as a mean value or a peak value rectifier.

10. Tuner according to claim 8, wherein an amplifier stage is arranged upstream of said weighting filter.

11. Tuner according claim 8, wherein said automatic gain control is integrated together with said tuner into a tuner module with a screened housing.

12. Tuner according to claim 8, wherein said tuner is designed for the reception of analog and digital television channels.

13. Circuit arrangement for reception of program channels, comprising:

a tuner having a control amplifier, an automatic gain control for said control amplifier and a mixer connected with an input to an output of said control amplifier, the circuit arrangement comprising further a channel filter coupled with an input to an output of said mixer for filtering out a desired program channel, said mixer converting said desired program channel into an intermediate frequency range for said channel filter, said automatic gain control comprising a detector and a weighting filter, the weighting filter being coupled with an output to an input of said detector and with an input to a tap arranged between the output of said mixer, upstream of and the input of said channel filter, for providing a control signal for said control amplifier via said detector, said weighting filter being a bandpass filter with a passband wider than the passband of said channel filter, which encompasses the passband of said channel filter and at least one adjacent program channel, for adapting said automatic gain control to given adjacent channel conditions of said channel filter; and wherein said tuner has a preselection circuit for the preselection of program channels, and a mixer oscillator for converting a desired program channel to the intermediate frequency range as defined by said channel filter.

14. Circuit arrangement according to claim 13, wherein said weighting filter has a passband which encompasses the passband of said channel filter and at least one adjacent program channel above said channel filter and one adjacent program channel below said channel filter.

15. Circuit arrangement according to claim 14, wherein said bandpass filter is adapted to given adjacent channel conditions of a transmission system.

16. Circuit arrangement according to claim 13, wherein said detector contains a diode and a capacitor and is designed as a rectifier.

17. Circuit arrangement according to claim 13, wherein an amplifier stage is arranged upstream of said weighting filter.

* * * * *